United States Patent [19]
Wojnar et al.

[11] Patent Number: 4,855,872
[45] Date of Patent: Aug. 8, 1989

[54] LEADLESS CERAMIC CHIP CARRIER PRINTED WIRING BOARD ADAPTER

[75] Inventors: Jeffrey S. Wojnar; Joseph H. McCusker, both of Mercer County, N.J.

[73] Assignee: General Electric Company, Schenectady, N.Y.

[21] Appl. No.: 84,788

[22] Filed: Aug. 13, 1987

[51] Int. Cl.$^4$ .............................................. H05K 1/14
[52] U.S. Cl. .................................. 361/414; 174/52.4; 361/398; 361/412
[58] Field of Search ............... 361/398, 413, 412, 414; 174/52 FP, 524

[56] References Cited

U.S. PATENT DOCUMENTS

| | | | |
|---|---|---|---|
| 3,628,105 | 12/1971 | Sakai | 174/52 FP |
| 3,662,230 | 5/1972 | Redwantz | 174/52 FP |
| 3,683,105 | 8/1972 | Shamash et al. | 174/52 FP X |
| 3,684,818 | 8/1972 | Nethrwood | 361/398 R |
| 4,177,519 | 12/1979 | Kasubuchi et al. | 364/712 |
| 4,413,308 | 11/1983 | Brown | 361/398 |
| 4,480,288 | 10/1984 | Gazdik et al. | 361/398 |
| 4,484,215 | 11/1984 | Pappas | 357/80 |
| 4,509,098 | 4/1985 | Dasgupta et al. | 361/398 |
| 4,563,725 | 1/1986 | Kirby | 174/52 FP X |
| 4,591,814 | 5/1986 | Ito et al. | 333/177 |
| 4,631,820 | 12/1986 | Harada et al. | 174/68.5 X |
| 4,658,332 | 4/1987 | Baker et al. | 361/398 |
| 4,736,520 | 4/1988 | Morris | 174/52 FP |

OTHER PUBLICATIONS

O. R. Abolafia, Chip Interconnection Device, IBM Tech. Disc. Bull., V. 15,#2, Jul. 1972 p. 420.
Larnerd et al., IC Package Assemblies, IBM Tech. Dis. Bull., V. 21,#5, Oct. 1978, pp. 1817 and 18.
Chen et al., Stress-Induced Thermal Coeficient System, V. 22,#1, IBM Tech. Disc. Bull., V. 22,#1, Jun. 1979, pp. 63 and 64.
Peter M. Hall, "Forces, Moments, and Displacements During Thermal Chamber Cycling of Leadless Ceramic Chip Carriers Soldered to Printed Boards," *IEEE Transactions On Components, Hybrids, And Manufacturing Technology*, vol. CHMT-7, No. 4, Dec. 1984, pp. 314–327.
Larry Hayes, "Polymer Multilayers for Chip Carrier Applications," *PC FAB*, Dec. 1984, pp. 49–50, 55–58.

*Primary Examiner*—R. R. Kucia
*Attorney, Agent, or Firm*—William Squire; James C. Davis, Jr.; Paul R. Webb, II

[57] ABSTRACT

A leadless ceramic chip carrier (LCCC) is attached to an organic printed wiring board (PWB) via a Kapton ® landing interface member. The LCCC Terminals are soldered to conductors on the interface member whose conductors are also soldered to mating conductors on the PWB. The member is epoxied to the PWB to hold the member in place during vapor phase solder reflow of the different solder joints.

4 Claims, 2 Drawing Sheets

LEADLESS CERAMIC CHIP CARRIER PRINTED WIRING BOARD ADAPTER

This invention relates to an adapter for coupling a leadless ceramic chip carrier to a printed wiring board for compensating differences in the coefficients of thermal expansion between the carrier and board.

Presently, large pin count e.g., 84 pins, leadless ceramic chip carriers (LCCC) are surface mounted to alumina printed wiring boards (PWB). Such boards have matched coefficients of thermal expansion (CTE) with the LCCC's. These assemblies are normally required to withstand temperatures which may range from $-55°$ C. to $125°$ C. It is important that the LCCC and PWB have matched CTE's to preclude solder joint failures which might otherwise occur should the two be thermally mismatched relative to their CTE's.

As the boards become larger to meet ever increasing demands for more complex circuitry, their cost increases substantially. The ceramic boards are relatively more costly than epoxy type boards. The epoxy type boards are both lower in cost and weight relative to ceramic boards. However, epoxy type boards have a CTE which is significantly different than that of the LCCC's. This thermal mismatch between the CTE's results in the different materials expanding and contracting different magnitudes for a given temperature excursion.

The solder joints couple the LCCC's and the boards connecting the LCCC terminals to the corresponding conductors on the boards. The stresses in the solder joints induced by the difference in CTE's of the different structures results in potential solder joint failure. Solder joint strains during accelerated temperature cycling have been shown to cause cracks in the solder and result in subsequent circuit failures.

At below room temperature, most of the expansion mismatch is accomodated by "bi-metallic strip" type bending of the printed wiring board and the LCCC. Above room temperature most of the mismatch is accomodated by shear in the solder. The various forces involved in the strain and stresses of the solder joints is discussed more thoroughly in an article entitled "Forces, Moments, and Displacements During Thermal Chamber Cycling of Leadless Ceramic Chip Carriers Soldered to Printed Boards," by Peter M. Hall, IEEE Transactions On Components, Hybrids, and Manufacturing Technology, Vol. CHMT-7, No. 4, December 1984, pp. 314–326. As shown in FIG. 5 in this article the LCCC and the PWB both tend to bend when stressed in response to thermal cycling if the PWB is free to bend. If the PWB is clamped the LCCC is still free to bend.

Because printed wiring boards of the epoxy organic material type tend to have a significant difference in the CTE than LCCC's the stresses on the solder joints tends to be exaggerated as discussed by the Hall article. The failures of the solder joints are accelerated as the thermal mismatch between the two materials increases. A second article entitled "Polymer Multilayers for Chip Carrier Applications", by Larry Hayes, PC FAB, December 1984, pp. 49–58, discusses thermal mismatch in the CTE's between LCCC's and polymer PWBs. The Hayes article indicates that considerable effort has been dedicated to CTE characterization of candidate materials due to the mismatch in CTE between the LCCC's and polymer PWB. One solution proposed is providing a blended resin with Kevlar ® reinforcement employing copper planes. A second approach suggests using a stress absorbing layer PWB. However, these composite materials and multiple layer PWB's tend to be relatively expensive and therefore increase the costliness of the PWB's considerably. The present inventors therefore recognize a need for a structure which can employ LCCC's and relative low cost epoxy type PWB's without adding significantly to the cost of the resulting structure. The present inventors recognize a need for employing conventional commercially available relatively low cost PWB's whose CTE's tend to be mismatched relative to the CTE's of the LCCC's.

According to the present invention an adapter for coupling a leadless ceramic chip carrier (LCCC) to a printed wiring board (PWB) wherein the LCCC has a CTE significantly different than that of the PWB comprises a pliable electrically non-conductive membrane secured to the LCCC at spaced points on the membrane. The spacing is such that the membrane tends to fold and bend relative to the LCCC when subjected to increasing temperature excursions of a given range. A plurality of electrical conductors are on a surface of the membrane. The electrical conductors are dimensioned, spaced and oriented so that one portion of these conductors can receive in registration therewith a corresponding portion of the LCCC terminals. Each electrical conductor on the membrane corresponds to a different terminal and to a different PWB conductor. The membrane is dimensioned, spaced and oriented so that each of a second portion of the conductors on the membrane can align with a separate, different corresponding PWB conductor when the membrane is juxtaposed with the PWB. The membrane is adapted to be bonded to the PWB at a region of the membrane adjacent to the second portion on a side of the membrane opposite the electrical conductors at the second portion.

Figure 1:
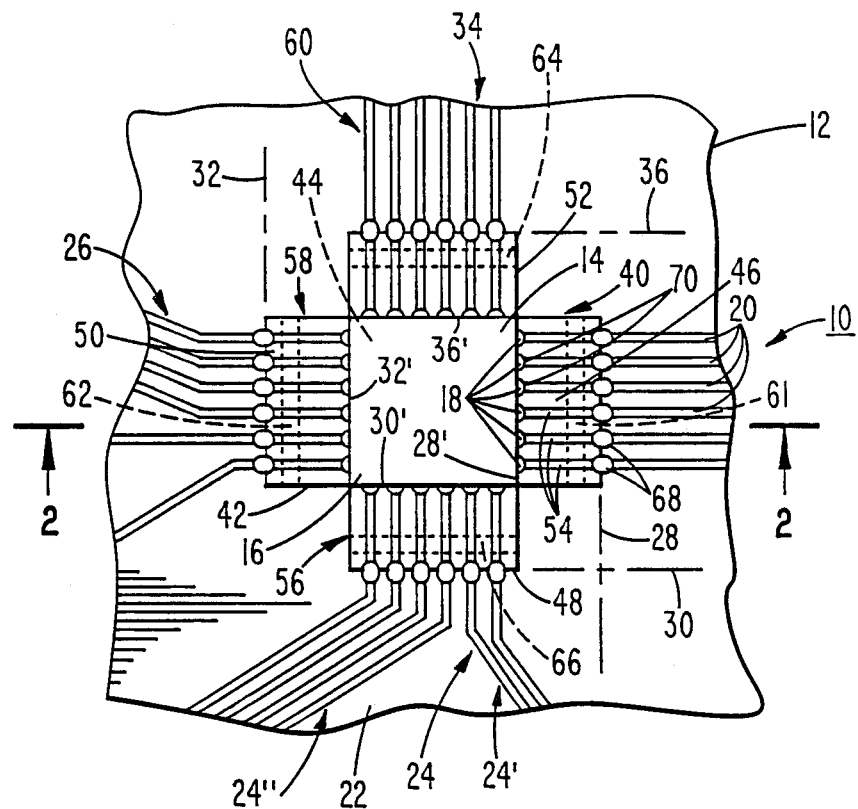
FIG. 1 is a plan view of an assembly according to one embodiment the present invention.
Figure 2:
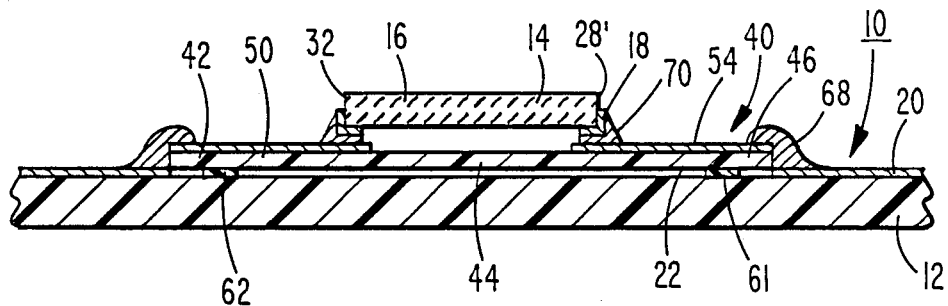
FIG. 2 is a sectional elevation view through the assembly of FIG. 1 taken along lines 2—2.

In FIGS. 1 and 2, assembly 10 comprises an organic printed wiring board (PWB) 12, an LCCC 14 and an adapter 40. Board 12 may be made of epoxy with glass fibers or other organic resinous material as employed in commercially available PWB's. LCCC 14 is square and of conventional design which includes a ceramic housing 16 having a periphery which may be about 2.5 centimeters (cm) in length on each side and containing 21 terminals 18 on each side or a total of 84 terminals. In FIG. 1 only six terminals are illustrated on a side for simplicity of illustration.

The LCCC body 16 is a ceramic material having a given CTE. The CTE ($\alpha$) of the ceramic housing 16 is generally about 6 ppm/° C. Generally the epoxy resin used in a PWB has a CTE of about 50 ppm/° C. or more. Usually such PWB's include glass fabric which constrains the CTE in the plane of the board to about 20 ppm/° C. As a result the PWB 12 has a significant different CTE than that of LCCC 14.

The PWB 12 has a plurality of conductors 20 on a broad surface 22 thereof. Conductors 20 are aligned in array so that there is one conductor 20 corresponding to each terminal 18. While some of the conductors 20 are shown parallel this need not be the case for all conductors on the PWB 12 which are intended to be connected to the different terminals of LCCC 14. For example, conductor array 24 includes a subarray 24' and a second subarray 24" which are non-parallel. Similarly, array 26 may differ in orientation as that of array 24 or conductors 20.

Conductors 20 terminate at axis 28 and conductor array 24 terminates at axis 30, perpendicular to axis 28. Array 26 terminates at axis 32 and array 34 terminates at axis 36. Axes 30 and 36 are parallel and axes 32 and 28 are parallel and are mutually perpendicular. Axes 32 and 28 are parallel to sides 32' and 28' of the housing 16. Sides 36' and 30' are parallel to axes 36 and 30.

A compliable adapter 40 couples LCCC 14 to the PWB 12 via the terminals of the LCCC. In FIGS. 1 and 2 adapter 40 comprises a relatively thin compliable membrane 42. Membrane 42 may be a relatively thin dielectric or other electrically non-conductive plastic material, such as Kapton ® which is a polyimide material. Membrane 42 in FIG. 1, comprises a central region 44 and a plurality of extension regions 46, 48, 50 and 52. Regions 46 and 50 extend in diametrically opposite directions parallel to axes 30 and 36. Regions 48 and 52 extend in parallel opposite directions normal to axes 30 and 36. Regions 46–52 form a somewhat cross shape in plan.

Region 46 contains an array of conductors 54. Each conductor 54 corresponds to a separate different terminal 18 at a side of LCCC 14, for example, side 28'. The conductors 54 are closely spaced, for example, about 1.2 mm spacing between adjacent conductors 54. Conductors 54 each have a width which closely matches that of the terminals on the LCCC which are of conventional dimensions. An array 56 of conductors is in region 48, identical to and normal to conductors 54 in region 46. An identical array 58 of conductors is in region 42 and an array 60 is in region 52.

Arrays 56 and 60 are parallel, equal in number and equal in length on their respective regions of the adapter membrane 42. The array 58 of conductors in region 50 is identical in number, length and dimension as the conductors 54 on region 46. However, they may differ in other embodiments. The conductors 54 and arrays 56, 58 and 60 are all on the same side of the membrane 42. The spacing and width of the conductors are the same and are oriented and positioned to be in registration with the respective terminals 18 on the corresponding facing side of LCCC 14. When the LCCC 14 is overlaid over adapter 40, each terminal 18 of the LCCC makes contact with and is juxtaposed with a separate corresponding conductor on the adapter 40. Thus terminals 18 on side 28' of the LCCC are in registration with the conductors 54. Similarly, the terminals on side 30' are in registration with the conductor array 56 and the terminals on sides 32' and 36' are respectfully in registration with conductor arrays 58 and 60.

The registration of the conductors of the adapter 40 with the LCCC terminals is adjacent to the innermost end of the conductors facing central region 44. The central region 44 is slightly smaller than the side length dimension of the LCCC body so as to ensure registration of the LCCC terminals with those conductors. The outer ends of each of the conductors on the adapter 40 terminate at the edge of the corresponding regions on which the conductors are placed. The spacing and alignment of each of the conductors on the adapter 40 is such that the conductors are aligned with a separate, different corresponding conductor on the PWB 12.

For example, conductors 20 on the PWB are aligned with conductors 54. Each conductor on the PWB is aligned with a different separate corresponding conductor 54 on adapter 40. The array of conductors 24 on the PWB are aligned with a separate corresponding conductor of the array 56 on the adapter 40 at axis 30. Each of the conductors of the arrays 26 and 34 are aligned respectively at the axes 32 and 36 with the mating corresponding conductors of the adapter 40.

In FIG. 2, the adapter 40 membrane 42 is bonded to PWB surface 22 by a plurality of linear epoxy adhesive beads 61, 62, 64 and 66. In the alternative, the beads could be applied as a array of spaced dots of adhesive. The beads are adjacent to the outermost edges of the member 42 but are spaced from those dges an amount sufficient so that the beads do not ooze over the conductors on the PWB for obvious reasons. The epoxy beads bond member 42 at its outer edges to the PWB prior to the soldering operation to hold the adapter in place during soldering.

After the epoxy is cured a solder paste is simultaneously applied to the conductors on the adapter 40 at areas adjacent to the conductors on the PWB, on the PWB conductors adjacent to the adapter conductors and to the adapter conductor areas receiving the LCCC terminals. The solder paste is applied in a conventional manner as by screening or other methods. The LCCC is also pre-solder pasted at each of its terminals in the usual manner. The pre-solder pasted terminals of the LCCC are then placed in registration with the conductors of the adater 40. The conductors of the adapter 40 extend sufficiently inwardly toward each other so that each of the terminals on the LCCC is in registration with the corresponding conductors on the adapter 40. There may be a plurality of such LCCC-adapter assemblies assembled on a PWB. The entire assembly is then passed into a vapor phase reflow soldering apparatus which melts the solder paste forming the solder joints.

In FIG. 2, solder joint 68 is formed between conductors 20 on the PWB 12 and conductors 54 on the adapter 40. The membrane 42 of the adapter 40 is of sufficient thin material, for example, 1–3 mm thick such that the joints 68 between the conductors 54 and the conductors 20 on the respective adapter and PWB bridges the gap formed by the thickness of the membrane and forms a solder joint therebetween as shown. The solder paste between the LCCC and the adapter 40 conductors forms solder joints 70 which mechanically and electrically couples the LCCC to the adapter 40. The epoxy beads 61–66 insure alignment is maintained between the adapter and the conductors on the PWB during the vapor phase reflow process. A mechanical coupling by the epoxy is not necessary once the solder joints 68 are in place.

As a result, the mechanical coupling of the LCCC 14 to the PWB occurs at the solder joints of the LCCC to the adapter 40 conductors and the adapter 40, in turn, is bonded to the PWB at regions spaced from the LCCC by the epoxy beads and by the PWB solder joints, e.g., joints 68.

In one form, the adapter 40 is so dimensioned that after the epoxy beads are formed, the adapter has some slack therein, i.e., it has some folds or slight bends. The purpose of these folds and bends is to permit the adapter to shrink somewhat relative to the PWB when exposed to decreasing temperature excursions without inducing tensile stress in the adapter. In this way the adapter exhibits relatively negligible tensile stress when the assembly is exposed to lower temperatures of a given temperature range. However, such folds and bends have been found to be not essential when Kapton ® is employed. In this case a Kapton ® adapter may be stressed somewhat in tension at reduced temperatures. Such stresses have been found by testing to have negligible effect on the stress bearing solder joints as described below.

When the assembly thus formed is exposed to temperature variations the compliant landing formed by the adapter 40 serves to isolate the LCCC 14 solder joints 70 from strain and stresses induced by the differences in CTE between the PWB 12 and the LCCC 14. In practice, the Kapton ® material forming the membrane 42 has a CTE which is greater than that of the PWB 12 which in turn is greater than that of the LCCC body 16. In the presence of increased temperature excursions, for example, to 125° C., the membrane 42 of the adapter 40 tends to buckle and fold in response to its greater expansion amplitude than that of either the PWB or the LCCC. The buckling or folding induces negligible stresses on the solder joints.

When exposed to temperatures below room temperature, for example −55° C., the Kapton ® material, which has a relatively low Youngs modulus, tends to contract more than the other materials, thus placing the adapter 40 in tension. The relatively low modulus and thinness of the Kapton ® membrane result in a relatively low tensile stress when the membrane contracts. As the temperature is reduced the stress strength of the solder joints increase. That increase of strength of the solder joints coupled with the relatively low tension of the Kapton ® tends to resist the increased tension load induced by the tension in the Kapton ® material. Therefore, the stress failure of the solder joints is precluded in the presence of increased and decreased temperatures.

Figure 3:
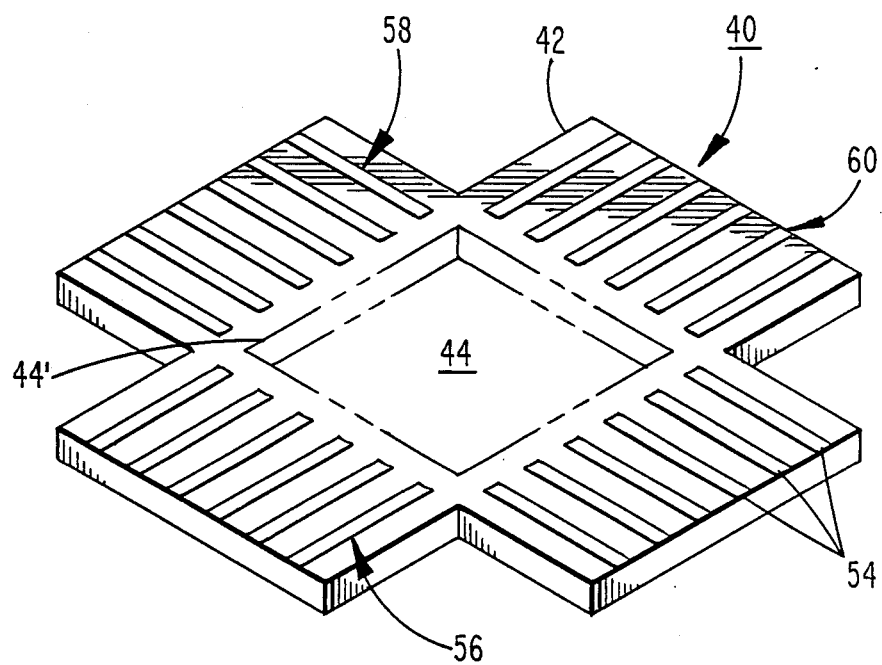
FIG. 3 is a isometric view of an adapter for coupling an LCCC to an epoxy type PWB according to the embodiment of FIG. 1 and 2.
Figure 4:
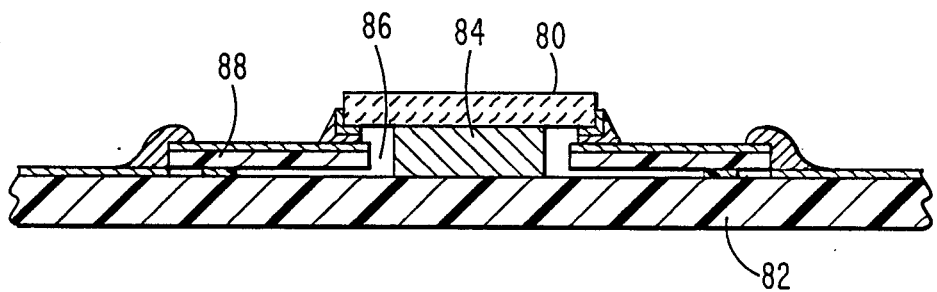
FIG.4 is a sectional elevation view through a second embodiment of the present invention.

In the alternative, FIG. 3, central region 44 of the member 42 may be removed as shown by the phantom square 44'. It also may be removed in a circular region (not shown). In this way, FIG. 4, a heat sink 84 may thermally conductively couple LCCC 80 to the PWB 82 to conduct heat from the LCCC. In this case, an aperture 86 in the adapter 88 provides a space for the heat sink 84. In other respects the assembly is similar to that discussed above in connection with FIGS. 1 and 2.

The assembly in accordance with the present invention was built and tested by cycling the assembly through 600 cycles of temperature excursions between −55° C. and +100° C. In this test the Kapton ® layer was about 1 mm thick and the LCCC was an 84 pin device having 21 terminals on a side. The conductors on the adapter, such as adapter 40 of FIGS. 1 and 2, were as shown except there were 21 conductors corresponding to each side of the LCCC. The conductors on the adapter were spaced approximately 1.2 mm center-to-center, which is equivalent to the spacing of the terminals on each side of the LCCC. No failures in any of the solder joints were observed in several samples that were tested.

What is claimed is:

1. A leadless ceramic chip carrier (LCCC) and a planar printed wiring board (PWB) assembly comprising:
   an LCCC having a plurality of terminals positioned in a first array;
   a PWB having a plurality of first conductors on a surface thereof each conductor corresponding to a terminal, said conductors terminating in a second array on said PWB surface;
   a pliable electrically non-conductive membrane having first and second surface and including a plurality of second conductors on said first surface, said second conductors terminating in said first array in one region of the membrane and in said second array in a second region of the membrane, said second region being adjacent to a peripheral edge of the membrane, the first conductors having corresponding second conductors, said membrane second surface and said PWB surface facing one another in juxtaposed relation;
   a plurality of first solder connections over said membrane peripheral edge connecting said first conductors to said second conductors at said terminating second array; and
   a plurality of second solder connections connecting said terminals to said second conductors at said terminating first array.

2. The assembly of claim 1 wherein said assembly further includes an adhesive for bonding said membrane second surface to said PWB surface adjacent to said first solder connections.

3. The assembly of claim 1 wherein said membrane comprises polyimide sheet material.

4. A leadless ceramic chip (LCCC) and printed wiring board (PWB) assembly comprising:
   a ceramic leadless LCCC having at least one peripheral edge defining an enclose geometric figure, said LCCC including a plurality of electrical terminals spaced along said at least one edge;
   a resinous PWB including a plurality of conductors on one surface thereof in a given orientation and spacing, each terminal corresponding to and for connection to at least one different PWB conductor;
   a polymide pliable member having first and second broad surfaces including an array of conductors on one of said surfaces, said member conductors being spaced, oriented and arranged in registration with said LCCC terminals, that member conductor in registration with a green terminal being aligned with said corresponding PWB conductor at an edge of the member, the other of said fist and second surfaces and said PWB one surface facing one another in juxtaposed relation;
   a first plurality of solde joints electrically conductively coupling said registered LCCC terminals and different member conductors and a second plurality of solder joints electrically conductively coupling each said aligned member conductor with its corresponding PWB conductor, said second plurality of solder joints extending over said edge of said member; and
   means for adheringly securing said member other surface to said PWB one surface at a local region of the member adjacent to said second plurality of solder joints.

* * * * *